US011167506B2

(12) United States Patent
Arrizabalaga Canellada et al.

(10) Patent No.: US 11,167,506 B2
(45) Date of Patent: Nov. 9, 2021

(54) ENCAPSULATED PHOTOVOLTAIC CELLS AND MODULES

(71) Applicant: FUNDACION TECNALIA RESEARCH & INNOVATION, Donostia—San Sebastián (ES)

(72) Inventors: Igor Arrizabalaga Canellada, Donostia—San Sebastián (ES); Sonia García Arrieta, Donostia—San Sebastián (ES); Gorka Imbuluzqueta García, Donostia—San Sebastián (ES); Maider Machado García, Donostia—San Sebastián (ES); José María Vega De Seoane López De Goicoechea, Donostia—San Sebastián (ES); Alexander Astigarraga Erleaga, Donostia—San Sebastián (ES); Olatz Ollo Escudero, Donostia—San Sebastián (ES); Eduardo Román Medina, Donostia—San Sebastián (ES); Francisco Jesús Cano Iranzo, Donostia—San Sebastián (ES); Oihana Zubillaga Alcorta, Donostia—San Sebastián (ES); Naiara Yurrita Murua, Donostia—San Sebastián (ES)

(73) Assignee: FUNDACION TECNALIA RESEARCH & INNOVATION, Donostia—San Sebastián (ES)

( * ) Notice: Subject to any disclaimer, the term of this patent is extended or adjusted under 35 U.S.C. 154(b) by 279 days.

(21) Appl. No.: 15/509,477

(22) PCT Filed: Sep. 8, 2015

(86) PCT No.: PCT/EP2015/070433
§ 371 (c)(1),
(2) Date: Mar. 7, 2017

(87) PCT Pub. No.: WO2016/038000
PCT Pub. Date: Mar. 17, 2016

(65) Prior Publication Data
US 2017/0250299 A1    Aug. 31, 2017

(30) Foreign Application Priority Data

Sep. 8, 2014 (EP) .................................... 14382333

(51) Int. Cl.
*B29C 70/44* (2006.01)
*B29C 70/48* (2006.01)
(Continued)

(52) U.S. Cl.
CPC ............ *B29C 70/48* (2013.01); *B29C 70/443* (2013.01); *B29C 70/865* (2013.01); *B32B 5/024* (2013.01);
(Continued)

(58) Field of Classification Search
CPC ........ B29C 70/443; B29C 70/44; B29C 70/48
See application file for complete search history.

(56) References Cited

U.S. PATENT DOCUMENTS

| 4,104,083 A | 8/1978 | Hirano |
| 6,537,483 B1 | 3/2003 | Cartwright et al. |

(Continued)

FOREIGN PATENT DOCUMENTS

| EP | 2043162 A2 | 4/2009 |
| EP | 2623314 A1 | 8/2013 |

(Continued)

OTHER PUBLICATIONS

Machine translation of JP 2010-221441; pp. 1-11 (Year: 2010).*
(Continued)

*Primary Examiner* — Edward J. Schmiedel
(74) *Attorney, Agent, or Firm* — Squire Patton Boggs (US) LLP (57) ABSTRACT

The disclosure relates to photovoltaic modules comprising one or more photovoltaic cells embedded in a fiber-reinforced composite thermosetting material, wherein at a front
(Continued)

side of the photovoltaic cells, the fiber-reinforced composite material comprises a substantially transparent resin, and substantially transparent fibers, and wherein the refractive indices of the resin and the glass fibers are substantially the same. In particular, the fibers can be glass fibers treated with aminosilane coupling agents and the resin can be an epoxy resin. Further disclosed are methods of manufacture of photovoltaic modules comprising one or more crystalline silicon photovoltaic cells comprising: providing a mold, one or more photovoltaic cells in the mold, and reinforcement fibers in the mold and positioning a bag surrounding the mold cavity. Then a vacuum is created in the bag substantially gradually, and the resin is infused with the mold due to the created vacuum.

3 Claims, 3 Drawing Sheets (51) Int. Cl.
| | | |
|---|---|---|
| | *B32B 5/26* | (2006.01) |
| | *H01L 31/18* | (2006.01) |
| | *H01L 31/048* | (2014.01) |
| | *B29C 70/86* | (2006.01) |
| | *B32B 5/02* | (2006.01) |
| | *B29K 63/00* | (2006.01) |
| | *B29K 105/08* | (2006.01) |
| | *B29K 309/08* | (2006.01) |
| | *B29L 31/34* | (2006.01) |

(52) U.S. Cl.
CPC .............. *B32B 5/26* (2013.01); *H01L 31/048* (2013.01); *H01L 31/0481* (2013.01); *H01L 31/18* (2013.01); *B29K 2063/00* (2013.01); *B29K 2105/0872* (2013.01); *B29K 2309/08* (2013.01); *B29L 2031/34* (2013.01); *B32B 2260/023* (2013.01); *B32B 2260/046* (2013.01); *B32B 2262/101* (2013.01); *B32B 2307/412* (2013.01); *B32B 2457/12* (2013.01); *Y02E 10/50* (2013.01)

(56) References Cited

U.S. PATENT DOCUMENTS

| | | | |
|---|---|---|---|
| 2004/0157519 A1* | 8/2004 | Goodell | ............... B29C 70/088 442/181 |
| 2005/0086916 A1* | 4/2005 | Caron | .................... B29C 43/12 55/382 |
| 2007/0063393 A1 | 3/2007 | Vernin et al. | |
| 2009/0178708 A1* | 7/2009 | Higashiyama | ........ H01L 31/048 136/256 |
| 2011/0036390 A1 | 2/2011 | Nelson et al. | |
| 2012/0225519 A1 | 9/2012 | Ehbing et al. | |
| 2014/0203468 A1* | 7/2014 | Humphries | ............. C04B 26/14 264/71 |
| 2014/0209171 A1 | 7/2014 | Ehbing et al. | |

FOREIGN PATENT DOCUMENTS

| | | |
|---|---|---|
| FR | 2934418 A1 | 1/2010 |
| JP | H09116176 A | 5/1997 |
| JP | 2006/026973 A | 2/2006 |
| JP | 2010/221441 A | 10/2010 |

OTHER PUBLICATIONS

Yang, Jinshui et al.; Compaction Behavior and Part Thickness Variation in Vacuum Infusion Molding Process; Appl. Compos. Materi (2012); 19; 443-458 (Year: 2012).*

International Search Report and Written Opinion dated Nov. 26, 2015 for PCT/EP2015/070433, 16 pages.

* cited by examiner

ENCAPSULATED PHOTOVOLTAIC CELLS AND MODULES

The present application claims the benefit of European patent application EP14382333.4 filed on Sep. 8, 2014.

The present disclosure relates to encapsulated photovoltaic cells and modules, and methods of manufacturing encapsulated photovoltaic cells and modules.

BACKGROUND

Photovoltaic modules may be formed by interconnected photovoltaic cells arranged in a structural and protective support. Such modules may then be placed in a suitable environment, e.g. on the roof of a building, or in an open field.

The modules, and in particular their structural supports may be designed so as to have suitable durability and protect the cells and connections in varying environmental conditions including e.g. humidity, water, UV radiation, particle abrasion, impact of objects or others.

At the same time, the materials forming the photovoltaic module must have sufficient structural capacity to assure a correct mechanical behavior thereof, providing the assembly with rigidity and mechanical strength. The photovoltaic modules should preferably also be manufactured at a relatively low cost. Weight is furthermore an important consideration.

Finally, it is important for the structural support to allow for efficient photoelectrical conversion in the photovoltaic cells. The encapsulating materials need to have sufficient optical transmittance, and the optical transmittance should be maintained over time in an acceptable degree.

Conventional solutions are based on laminates consisting of a back sheet, front sheet and encapsulant material embedding the cells. The back sheet may be glass, polymer, metal, or combined laminates. The front sheet is usually glass or may be a transparent polymeric sheet. The encapsulant material generally consists of a polymer that flows in the lamination process embedding the cells and is adhered to the back sheet and front sheet.

It is furthermore known in the art to use fiber-reinforced thermosetting resin composites as a support. However, the optical transmittance of the module is generally compromised, leading to reduced efficiency of the photovoltaic cells employed.

SUMMARY

In a first aspect, the present disclosure provides a photovoltaic module comprising one or more photovoltaic cells encapsulated in a fiber-reinforced composite material. The photovoltaic cells have a front side to be irradiated and a back side. At the front side of the photovoltaic cells, the fiber-reinforced composite material comprises a substantially transparent resin, and substantially transparent fibers, wherein the refractive indices of the resin and the fibers are substantially the same.

In this aspect, the beneficial mechanical characteristics of fiber-reinforced composites are taken advantage of by combining a substantially low weight with sufficient strength and stiffness. At the same time, by choosing a substantially transparent resin and fibers, and by matching the refractive indices (i.e. obtaining refractive indices that are the same or substantially the same) of both the fibers and the resin, light diffusion within the composite encapsulation is reduced. This thus allows an improved efficiency of the photovoltaic module.

Transparency (for fibers and resin) as used herein may be understood to mean light transmittance of preferably 80% or more or more preferably 90% or more in a light wavelength region of 300 nm to 2000 nm.

Matching of the refractive indices may herein be understood to mean that the refractive indices differ less than 2% from each other, and preferably less than 1%, and more preferably less than 0.5%.

The photovoltaic cells may be completely embedded by the composite. The photovoltaic module as described in examples of the present disclosure combines aspects of structural capacity, optical transmittance, adaptability to non-planar geometries, protection, weight and reduction of stages in the manufacturing process, with respect to known techniques.

Herein, a front side may be regarded as the side of the photoelectric cells which is to be irradiated by the sun. And a back side may be regarded as the opposite side. In some examples, also a back side may be irradiated by the sun, e.g. when bifacial solar cells are used.

The cells and their connections can be completely embedded within the composite material. The need to use additional materials as back sheet, front sheet, or frame is eliminated. The module as such may thus be substantially or completely self-supporting.

In some examples, at a front side of the photovoltaic cells, a combination of resin and fibers may be provided that has been selected for achieving low void content. A good adhesion of fibers and resin is important to reduce or eliminate voids in the composite. A reduction of voids may reduce light diffusion and may thus potentially increase conversion efficiency of the module.

A low void content may herein generally be understood as a void content of less than 2%, and preferably lower than 1%.

In some examples, an epoxy resin may be used and may optionally be combined with glass fibers treated with silane coupling agents. Silanes have the ability to bond inorganic materials such as glass, mineral fillers, metals and metallic oxides to organic resins.

Silane coupling agents can notably improve the bond between fiber and resin. Furthermore, the treatment of the glass fibers with the silane coupling agents may allow a matching of the refractive index of the fibers and the resin.

Other factors to be taken into account for selecting a suitable resin include:
  viscosity and pot-life allowing complete embedding of the module
  suitable mechanical properties and thermal resistance
  UV resistance (possibly with additives)
  adhesion to the photovoltaic cells and their connections In some examples, the fiber-reinforced composite material for a front side of the photovoltaic modules may be different than the fiber-reinforced composite material for the back side of the photovoltaic modules. In these examples, the composite material, and in particular the fibers may be optimized for e.g. optical transmittance at a front face of the photovoltaic cells, wherein at a back face of the photovoltaic cells, the material may be optimized as to cost, strength/weight ratio or others.

Optionally, in these examples, the fibers are different (at a front side than at a back side of the photovoltaic cells) and the resin is the same. This allows for ease of manufacture and offers the possibility of speeding up manufacturing processes. Since the fibers on a back side of the photovoltaic cells are generally not critical from a point of view of transmittance, there is more liberty as to the choice of fibers. For example, also fiber layers with increased areal weight may be chosen, so that a reduced number of layers is required.

In alternative examples, particularly for ease of manufacture, the composite materials (both resin and fibers) may be the same for the front side and the back side of the photovoltaic cells.

In some examples, the modules may be bifacial, i.e. the photovoltaic cells may be irradiated from two sides. Both the front and back side can therefore be irradiated and it is desirable to optimize light transmittance on both sides. Also, modules including spherical cells may be envisaged which may be irradiated along their whole surface area.

In another aspect, a method of manufacture of photovoltaic modules comprising one or more crystalline silicon photovoltaic cells is provided. The method comprises providing a mold, providing one or more photovoltaic cells in the mold, and providing reinforcement fibers in the mold both on a front face of the cells and on a back face of the cells. A bag can be arranged to surround the mold cavity, and a vacuum in the bag can be created. Then, a resin is infused within the vacuum bag due to the created vacuum. The creation of the vacuum in the bag may be done in a gradual manner.

In accordance with this aspect, a method of manufacturing photovoltaic modules is provided that is particularly suitable for crystalline silicon photovoltaic cells. Vacuum bag infusion is well known in the art of manufacturing composite products. Inventors have found in the connection with the creation of an encapsulation of crystalline silicon photovoltaic cells, that a modified vacuum bag infusion process is needed. It was namely found that crystalline silicon cells can break if the vacuum is not supplied sufficiently gradually.

In some examples, the creating a vacuum in the bag may comprise creating an underpressure of a first level relatively rapidly, and gradually increasing the underpressure of the first level until a substantial vacuum is reached. In these examples, manufacturing speed may be maintained, whereas scrap or fallout of broken cells during manufacture can be reduced or eliminated.

In some examples, the first level may be between 0.6-0.85 bar underpressure, preferably between 0.6 and 0.8 bar underpressure. Inventors have found that cracking or breaking of crystalline silicon photovoltaic cells occurs at abrupt underpressures applied above the 0.8 bar vacuum value, particularly more than 0.85 bar. I.e. if ambient pressure is 1 bar, then the pressure in the mold cavity would be below 0.2 or 0.15 bar. By gradually increasing the underpressure past these limit values, cracking and breaking can be reduced substantially or avoided completely.

In some examples, providing reinforcement fibers in the mold on the front face of the cells may comprise providing at least four layers of fibers, and optionally six layers of fibers are placed on the front face of the photovoltaic cells. Inventors have found that the number of layers of fibers influences the cracking of photovoltaic cells as well. In particular, it was found that at least four layers of fibers are beneficial at a front face, in order to avoid cell cracking. When fibers of a lower areal weight were used, it was found that in some cases for silicon photovoltaic cells, at least six layers of fibers were required. In general, it may be said that by increasing the number of layers, the cells are in a way better protected, and thus the speed of applying the vacuum can be increased as well without damaging the cells.

BRIEF DESCRIPTION OF THE DRAWINGS

Particular non-limiting examples of the present disclosure will be described in the following with reference to the appended drawings, in which.

DETAILED DESCRIPTION

Figure 1:
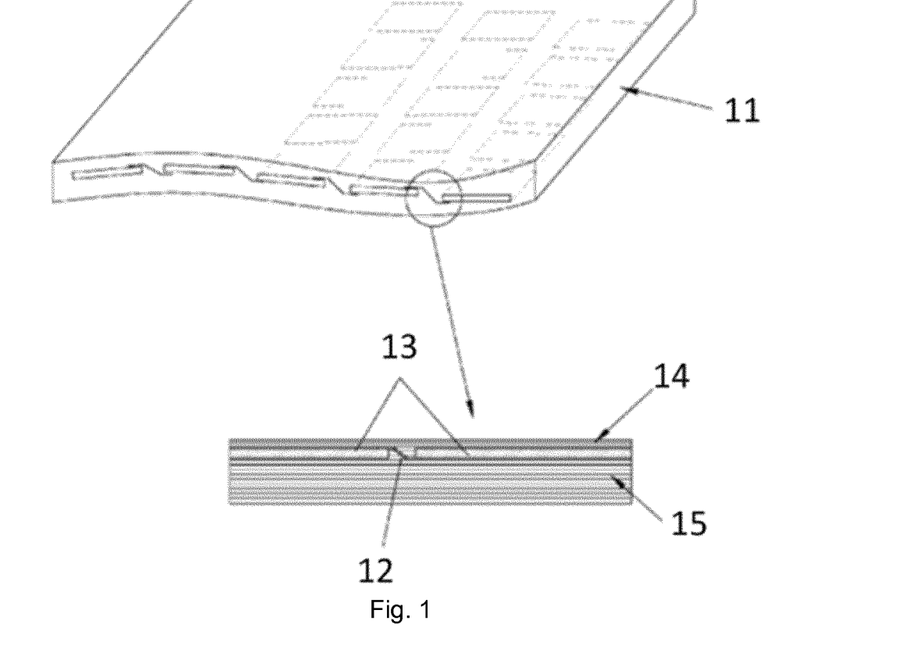
FIG. 1 is a schematic representation of an example of a photovoltaic module according to an implementation.

FIG. 1 is a schematic representation of an example of a photovoltaic module according to an implementation. The example photovoltaic module may be manufactured in a single process, in which the composite material acts as a base and covering at the same time.

A module encapsulated in a composite material may be obtained through embedding the photovoltaic cells 13 and their connections 12 in a fibre-reinforced composite. In this example, a plurality of photovoltaic cells is provided in a module. These cells are interconnected. At an edge of the module, electrical connectors are provided.

A transparent resin may be provided, such as e.g. a polyester resin, epoxy resin, vinylester resin or other transparent ones. A suitable transparent fiber for refraction index matching after bonding with the resin may also be selected. The transparent fiber may undergo a treatment to achieve matching refractive indices with the resin. As a result of such a treatment, the fiber may or may not be transparent. After bonding with the resin, the fiber will (again) be substantially transparent.

By matching the refractive index of the fibers with the refractive index of the resin, light diffusion within the module can be significantly reduced and the efficiency of the resulting photovoltaic module may be improved. Several options exist for matching refractive indices of fibers and resins including chemical treatments of fibers and inclusion of nanosized compounds in the resin.

In one example, a glass fiber laminate 14, in which the fiber reinforcement has been subjected to a prior treatment with silane coupling agents, may be created at least at the front part of the cell or assembly of interconnected cells (i.e. the part which will face the solar radiation when the cell is operating). The surface of the glass fiber is modified with aminosilane compounds covalently attached to the fiber.

Aminosilane groups or compounds as used herein may be understood to be a silane containing at least one amino group.

An epoxy resin may be composed of diglycidyl ether of bisphenol A and bisphenol F. The amino groups present on the surface of the fiber due to the aminosilane coupling agents can chemically react with the oxyrane groups of the uncured epoxy resin.

After such a reaction, the refractive indices of the reinforcement fiber and the resin may be substantially the same. Additionally, the reaction results in a covalent bonding of the resin to the fiber, with a low voids percentage. Other interface phenomena affecting the optical transmittance may also be avoided.

An alternative epoxy resin that may be used in examples of the present disclosure is an aliphatic or cycloaliphatic epoxy resin. These molecules comprise aliphatic or cycloaliphatic group structures (without aromatic units). The chemical reaction with the aminosilane in this example is also based on the oxyrane groups. Compared to the previously mentioned resin, higher resistance to solar radiation (UV resistance, and anti-yellowing properties) can be achieved because of the lack of aromatic groups.

The resin may be thermally cured through a cycloaliphatic amine catalyst. An example of such a catalyst is 4,4'diaminocyclohexyl methane. Advantageously, neither the resin components, nor the catalyst substantially react with the photovoltaic cells or the electrical connection materials and joints in the sense that the cells, the electrical connection materials and joints are not damaged in the process.

A polished low roughness surface finish of the front face of the photovoltaic module may reduce light diffusion and thus further increase the efficiency of the embedded photovoltaic cells. Such a low roughness surface may be obtained using a polished mold. The PV (photovoltaic) module can also incorporate a finish layer in the front and/or back surfaces, based on gel-coat or top-coat, for the improvement of the surface properties of the module, such as abrasion and wear resistance, surface hardness, aging against environmental agents, or others.

The resin can comprise one or several additives for additional functionalities, such as improvement of resistance against environmental agents, coloring, filtering and conversion of incident radiation wavelengths, or others.

Another laminate 15 may be created at a back side of the photoelectric cells, i.e. on the side that is not to be irradiated by the sun. In some examples, the same resin is used both at front side and at a back side, but the type of fiber may be varied. E.g. another type of glass fiber may be used, or another type of fibers such as aramid fibers, carbon fibers, etc.

Once processed, this assembly will form the photovoltaic module 11. Notably, depending on the application, no further structural support (either a metallic frame or otherwise) may be necessary.

Depending on the type of photovoltaic cells, fibers and resins used, the molding process can be performed by means of the vacuum bag infusion of the resin or by means of injecting the resin into a mold. Alternatively, the molding may be performed by manual impregnation. The reinforcing elements can be dry fibers. The molding can also be performed by means of using vacuum bag prepreg technology with or without autoclave curing.

Prior to the molding with resin, further fibers (e.g. aramid fibers, carbon fibers, boron fibers or a combination thereof) can be placed in the back face of the cell or cells.

The module thus produced comprises at least one photovoltaic cell and its corresponding electrical connections, and a composite comprising a matrix of thermosetting polymer resin.

The processes used for that purpose mentioned before are vacuum bag infusion, RTM (Resin Transfer Molding), manual lamination or lamination by means of prepregs with or without autoclave curing. Each of these mentioned processes is shortly described below:

Vacuum bag infusion: this process generally consists of molding composites by means of introducing resin into a cavity that has previously been created between a mold and a vacuum bag sealing the actual cavity with respect to the exterior. The resin enters by the action of a vacuum pressure inside this cavity. Before the infusion of the resin, the fibers as well as the interconnected cells and other electrical connections (or the cell and its connections if the module is made up of a single cell) are placed in the cavity. Fibers may be provided both at a front and at a back side of the photovoltaic cells. The resin, which may be premixed and degassed in an external container, may then be infused and can fill the cavity, flowing through the fiber reinforcement and around the cells. Once the cavity is full, the vacuum can be maintained for the time necessary for the curing and solidification of the resin. Once cured, the module can be unmolded. If the resin is not completely cured in the mold, it can be subjected to further curing or post-curing cycles.

RTM-resin transfer molding: this process consists of molding by means of injecting resin inside a closed mold. Fibers may again be provided both at a front and at a back side of the photovoltaic cells arranged in the mold. Once the mold is closed, the resin may be introduced inside this mold by means of a pressurized injection. The resin flows through the fiber and around the photovoltaic cells, embedding them and completely filling the mold. Once the correct filling of the mold is assured, the resin is cured and post-cured, and the photovoltaic module can subsequently be unmolded. In a variant of this process, resin transfer is vacuum aided together with the injection pressure, in which case the process is called VARTM (vacuum assisted RTM).

Manual lamination (hand-lay-up): This process consists of placing the fiber reinforcement in dry form. Thereafter, the fibers are manually impregnated with resin. The layers of fiber and the interconnected cells, forming an assembly of layers of fiber on both sides of the cells, are arranged on a mold. The impregnation of the fiber is carried out by using manual methods and by means of using tools such as impregnation rollers, brushes or others. A vacuum bag may be subsequently manufactured on the mentioned laminate and the cavity is closed with a sealing material. If the curing of the resin requires it, this assembly can be introduced into an oven in which the conditions necessary for the curing and compaction of the laminate are applied, according to the type of resin used. These conditions can include vacuum and temperature, depending on the curing cycle of the resin. Once the resin has cured, the photovoltaic module is unmolded.

Lamination by means of prepregs: in this case, fibers which previously have been impregnated with the already premixed resin ("prepregs") are used. The prepreg and the interconnected cells are arranged forming an assembly of preimpregnated fibers on both sides of the cells on a mold. Using a vacuum bag system, the cavity can be closed with a sealing material. This assembly may then be introduced in an autoclave or in an oven, in which the conditions necessary for the curing and compaction of the laminate are applied, depending on the type of resin used. These conditions can include a specific pressure, vacuum and/or temperature. Once the resin has cured, the photovoltaic module can be unmolded.

Figure 2A:
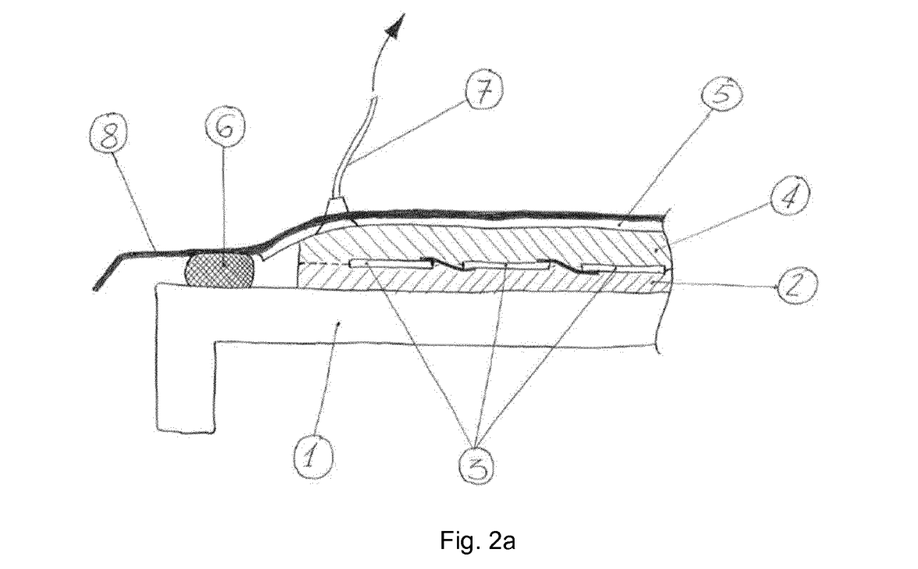
FIGS. 2a and 2b schematically illustrate an example of a method of manufacturing a photovoltaic module according to an implementation.
Figure 2B:
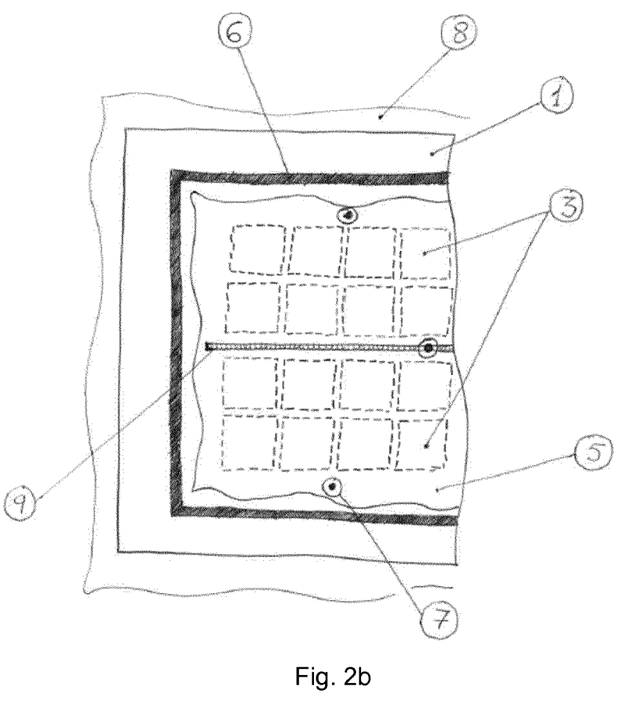

FIGS. 2*a* and 2*b* schematically illustrate an example of a manufacturing method that is particularly suitable for crystalline silicon solar cells. Such methods may also be used for other types of cells.

A mold 1 may be provided with a suitable shape for the resulting photovoltaic module. Fiber reinforcement layers 2 (e.g. glass fiber layers) may be placed onto the mold 1 surface. These layers will be placed in the front-side of the final resulting module. A good adaptation of the fibers to the mold is important, in order to achieve a good compaction and avoid subsequent undesirable voids in the part. To achieve a good adaptation of the fibers to the mold, inventors have found that it can be beneficial to use thinner (lighter) fiber materials. For example, glass fibers weighing 162 g/m$^2$ can be used.

The fiber layers 2 on the front face of the module are the layers that protect solar cells (e.g. silicon cells) from being damaged by the mold. These fibers should allow for some deformation and for adaptation of the cells to the mold surface when vacuum is applied, avoiding the breakage of the cells.

The solar cells 3 may be placed, according to the desired configuration and arrangement onto the fiber layers. If a plurality of solar cells or cell strings is provided, the solar cells or strings may then be interconnected according to the desired electrical configuration and scheme.

The rest of the reinforcement fiber layers 4 may then be placed onto the interconnected cells (which will result to be the back side of the cells), so that the desired part thickness (and strength) is achieved. As mentioned before, the fibers used at a back side of the solar cells may in some examples be different from the fibers used in the front.

A peel ply 5 may be placed, which will eventually help for the auxiliary material to be removed after resin infusion. A peel ply may further serve to achieve a better back-side finishing.

Vacuum points with valves 7 and resin inlet points and channels 9 may be suitably placed. The inlet points and channels are placed to make sure that the resin will flow and fill the whole module area before curing, while maintaining an adequate viscosity to flow and wet the fibers. It will be clear that the number of inlet points, channels and their exact location may be varied in accordance with e.g. module size, geometrical aspects and process strategy. Throttle valves may be used.

A vacuum bag 8 can be mounted and the bag can be sealed by the sealant tape 6 along a perimeter of the mold. Before resin infusion is started, all auxiliary elements including e.g. resin channels can be suitably sealed. Also, the electrical connectors or connections to the photovoltaic cells and sticking out of the mold may be properly sealed, so that once an underpressure is created, this underpressure is maintained as much as possible without any leaks.

Then, a vacuum may be applied gradually. The vacuum may be applied starting at a level of underpressure equivalent to 0.6 bar (manometric pressure).

Subsequently, in an example, the vacuum level may be raised at a rate of substantially 0.1 bar/min. until an underpressure of 0.7 bar is achieved. Then a dwell period may be used during which the pressure may be kept constant e.g. for 2 minutes. Afterwards, the pressure in the bag may be further reduced to an underpressure of 0.8 bar at the same rate as before. Once again, a dwell period may be introduced.

Continuing the same procedure, again the underpressure may be increased to 0.9 bar at the same rate of 0.1 bar/min as before. After another dwell period, finally a vacuum may be reached.

In other examples, an underpressure in a first step may reach a higher level, e.g. 0.7 or 0.8 bar instead of 0.6 bar mentioned before. After this level is reached, a dwell period may be introduced. Then again, the underpressure may be increased at a rate of 0.05 bar/min-0.15 bar/min, in particular 0.1 bar/min. Optionally, further dwell periods may be introduced.

For example, dwell periods may be introduced after increments of between 0.05 and 0.2 bar, optionally around 0.1 bar.

Inventors have found that applying vacuum in a gradual manner, the solar cells do not crack further. The photovoltaic cells, in particular silicon crystalline cells, consist of very fragile material and often already present microcracks before the resin injection. Without being bound to any theory, it is believed that the gradual reduction of pressure allows the cells time to accommodate to the required deformation. If the deformation rate is slower, the deformability limit of the cells is higher, and their breakage is avoided.

It has been found that cracking particularly occurs at abrupt underpressures greater than 0.8 or 0.85 bar. In preferred examples therefore, the first step of the multi-step process has a limit of underpressure below these values. Subsequently, the rate of pressure reduction is reduced to e.g. 0.1 bar/min or lower, optionally including dwell periods.

The inventors have furthermore found that the thickness of fiber mats or fabrics, and the number of layers of fiber mats or fabrics have an influence as well. In some examples, at least six layers of glass fibers of 162 g/m$^2$ are provided on a front surface of the photovoltaic cells (i.e. in between the mold and the cells) are provided. In other examples, four or five layers of 300 g/m2 can be used. The fibers to a certain extent protect the cells from cracking during manufacturing process. The number of layers of fiber and their weight can also be less if the vacuum is applied sufficiently gradually.

During resin infusion, the vacuum may be continuously checked. If the vacuum is lost at a relatively high rate (e.g. more than 0.02 bar in 15 minutes), a vacuum can be reapplied and air leaks can be checked and sealed properly. After resin infusion, the module may be left to cure, for example in an oven.

A further example of a photovoltaic module may be illustrated with reference to FIG. 3.

A photovoltaic module may be obtained in the following manner: A mold is provided and firstly, a release agent is applied onto the inside of the mold. The goal of the release agent is to enable easier removal or "release" from the mold surface.

Then, six layers of previously cut glass fiber woven fabric with twill 2/2 weave, and treated with an aminosilane coupling agent may be placed in the mold. The woven glass fiber fabric may have an areal weight of 162 g/m$^2$. These six layers of fabric will eventually form the front surface of the photovoltaic module. These layers also serve as a sort of protection for the photovoltaic cells when vacuum is applied and during resin infusion.

On top of these fiber layers, solar PV cells may be placed. In this case, two rows of five cells are placed. The cells are then interconnected and two output terminals are arranged to "stick out" from the module.

Then, on top of the photovoltaic cells, further fiber reinforcement layers may be placed. In this particular example, 14 further layers of the same composition are placed on the back side of the photovoltaic cells. The resulting module thickness is approximately 3 mm.

Subsequently, a peel-ply layer, resin feeding channels, resin inlet valves and vacuum points etc. may be placed. Then the mold may be sealed using sealing tape and a vacuum bag. To this end, a border of the mold may have been left free from release agent. In this particular example, a 50 micron thick vacuum bag was used.

The output terminals of the module must go through the fiber reinforcement layers and the vacuum bag. The output of these terminals must be sufficiently sealed so that air tightness is assured so a maximum vacuum value can be achieved.

In accordance with previously described methods, a vacuum is applied gradually, from 0 to 1 bar, in order to avoid breaking of PV cells.

Once vacuum has been applied and checked, resin and hardener may be mixed in a clean container and in the adequate mixing rates, which in this specific example were as follows: a mixture of diglycidyl ether of bisphenol A and bisphenol F epoxy resin, with cycloaliphatic amine catalyst as hardener in a rate of 100/17.

Subsequently, degassing of the resin mix may be carried out. Subsequently, resin infusion may start. After complete infusion, the part may be left to cure at room temperature inside the mold until solidification, and afterwards is released from the mold.

Once released from the mold, the part may be introduced into an oven at 110° C. for 5 hours for further curing.

Figure 3A:
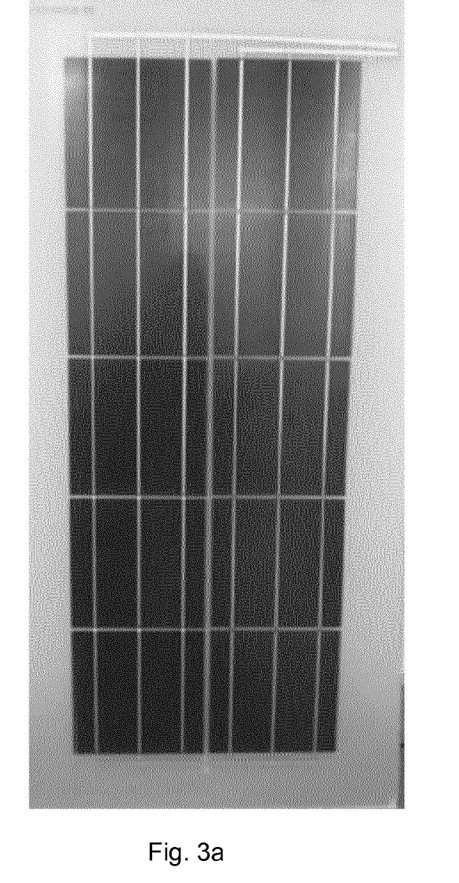
FIG. 3a shows a photo of a module and FIG. 3b shows a photo image of an electroluminescence analysis of a photovoltaic module obtained according to an example of a method of manufacturing described herein.
Figure 3B:
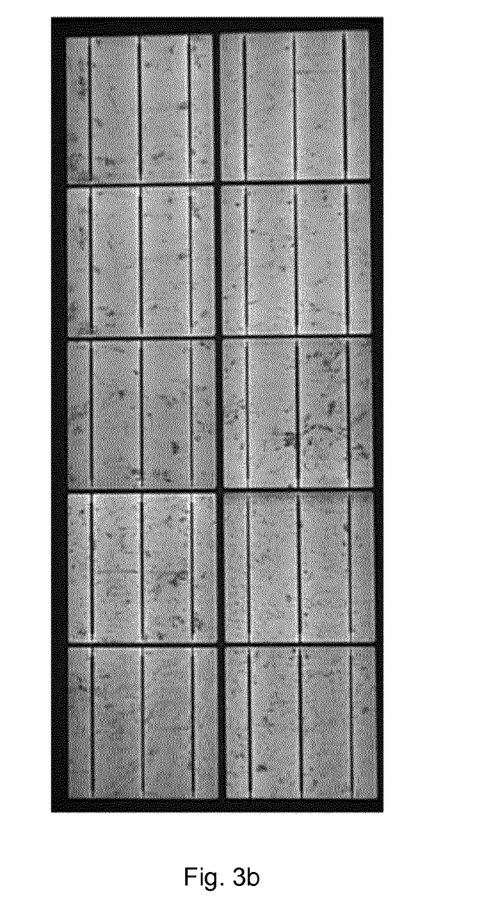

The resulting module is shown in a photo in FIG. 3a. In this particular example, 10 polycrystalline silicon cells arranged in two strings or rows of 5 cells each. The cells comprise 3 bus bars and have dimensions of a 156×156 mm. The resulting module dimensions are approximately 930× 470×3 mm.

As explained previously, the vacuum may be applied in a gradual manner. As such, damage in the PV cells can be avoided. This may be verified with an electroluminescence analysis image as shown in FIG. 3b.

The electrical performance of the module under standard conditions of AM 1.5 and 1000 W/m$^2$ may be summarized in the following table.

| | |
|---|---|
| P | 37.8 W |
| $I_{sc}$ | 7.92 A |
| $V_{oc}$ | 6.3 V |
| $V_{max}$ | 5.1 V |
| $I_{max}$ | 7.46 A |

Herein, P refers to power, $I_{sc}$ refers to the short circuit current, $V_{oc}$ refers to the open circuit voltage, $V_{max}$ refers to the voltage at maximum power and $I_{max}$ refers to the current at maximum power. The same acronyms and signs are used in the further examples below.

The possible degradation of the electrical performance under mechanical loading was also tested for the specific photovoltaic module.

The module was tested under uniform mechanical load. 3 cycles of 2400 Pa load were applied, each at the front side and back side, and alternatively. The duration of each cycle was 1 hour. The maximum buckling measured under this load was 2.2 cm. Afterwards, a 5400 Pa load was applied, and a maximum buckling of 3.3 cm was measured.

The electrical performance after mechanical load testing may be summarized in the following table:

| | Before test | After 2400 Pa cycles | After 5400 Pa |
|---|---|---|---|
| P | 37.8 W | 37.9 W | 38.2 W |
| $I_{sc}$ | 7.92 A | 7.96 A | 7.97 W |
| $V_{oc}$ | 6.3 V | 6.3 V | 6.3 V |
| $V_{max}$ | 5.1 V | 5.1 V | 5.1 V |
| $I_{max}$ | 7.46 | 7.48 V | 7.52 W |

As may be seen from the table above, electrical performance was not significantly affected. An electroluminescence image did not show cell damage after the mechanical loading test.

It may thus be concluded that a monolithic photovoltaic module as described herein, and manufacturing according to the principles explained herein performs well mechanically (i.e. are self supporting) without the need for any further reinforcement, such as a glass plate or a metal frame. The module also performs well electrically.

Figure 4:
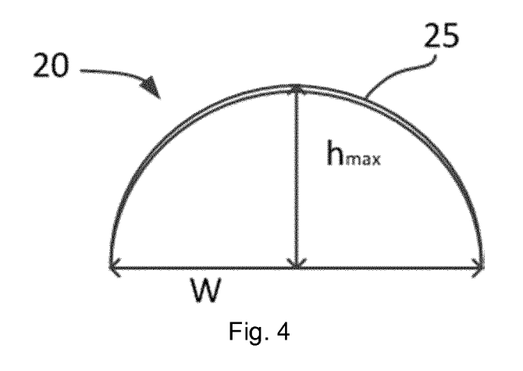
FIG. 4 schematically illustrates another example of a photovoltaic module according to another implementation.

A further example of a photovoltaic module as obtained with methods described herein may be explained with reference to FIG. 4. In this example, a curved composite monomodule (a module with a single cell) of a flexible CIGS cell is provided.

The manufacturing process is generally similar to the process previously explained with reference to FIG. 3. However in this example, the vacuum was not applied gradually. In contrast to crystalline silicon cells the CIGS cells can withstand non gradual vacuum application. The manufacturing process may thus be shortened.

At the back side of the photovoltaic cells, 14 layers of woven glass fiber (twill 2/2) with 162 g/m$^2$ were placed, whereas in the front side only two layers of the same fibers were placed. Epoxy resin composed of diglycidyl ether of bisphenol A and bisphenol F was used and a curved aluminum mold with polished surface finish was used.

The dimensions of the module (with reference to FIG. 4) and the electrical performance may be summarized in the table below. The electrical performance was tested under standard conditions of 1.5 AM spectrum and 1000 W/m$^2$ irradiation.

| Dimensions of the sample (mm) | |
|---|---|
| Height (h) | 45 |
| Width (w) | 132 |
| Length (l) | 240 |
| Thickness (t) | 1 |
| Current and Voltage | |
| $I_{sc}$ | 5.919 A |
| $V_{oc}$ | 0.603 V |
| P | 1.181 W |
| $I_{max}$ | 3.755 A |
| $V_{max}$ | 0.315 V |
| FF | 33.1% |
| Eff. | 5.6% |

Herein, FF refers to fill factor and Eff. to module efficiency.

Some results of further tests are summarized below. Various examples of monomodules with different number of fiber layers and different areal weight of these layers were tested.

Following generally the same procedure described with reference to FIG. 3, crystalline silicon cells were encapsulated. The glass fiber layers in all examples was woven glass fiber layer, treated with an aminosilane agent and twill 2/2. In each example, 14 layers of 162 g/m$^2$ fibers were placed at the back side of the cells, and the same epoxy resin was used in all the examples.

In each example, different number of fiber layers and fibers with different areal weight were placed at the front side of the cells. The different compositions are summarized in the table below:

| Reference | PV cell | N° fabric layer (front) | Areal weight (g/m² reinforcement) (front) |
|---|---|---|---|
| Si 2-162 | Silicon | 2 | 162 |
| Si 4-162 | Silicon | 4 | 162 |
| Si 6-162 | Silicon | 6 | 162 |
| Si-6-125 | Silicon | 6 | 125 |
| Si-2-300 | Silicon | 2 | 300 |

The electrical performance was tested under standard conditions of 1.5 AM spectrum and 1000 W/m² irradiation and the performance of cells before and after encapsulation was compared.

Electrical performance before and after encapsulation:

| Si 2-162 | No encapsulation | Encapsulated | Δ |
|---|---|---|---|
| $I_{sc}$ (A) | 5.65 | 5.61 | −0.7% |
| $V_{oc}$ (V) | 0.610 | 0.606 | −0.7% |
| $I_{max}$ (A) | 5.14 | 5.07 | −1.4% |
| $V_{max}$ (V) | 0.464 | 0.465 | 0.2% |
| FF (%) | 69.3 | 69.3 | 0.0% |
| P (W) | 2.386 | 2.357 | −1.2% |
| Eff (%) | 15.3 | 15.1 | −1.3% |

| Si 4-162 | No encapsulation | Encapsulated | Δ |
|---|---|---|---|
| $I_{sc}$ (A) | 5.62 | 5.53 | −1.6% |
| $V_{oc}$ (V) | 0.607 | 0.604 | −0.5% |
| $I_{max}$ (A) | 5.10 | 5.00 | −2.0% |
| $V_{max}$ (V) | 0.461 | 0.461 | 0.0% |
| FF (%) | 68.8 | 69.0 | 0.3% |
| P (W) | 2.348 | 2.301 | −2.0% |
| Eff | 15.0 | 14.7 | −2.0% |

| Si 6-162 | No encapsulation | Encapsulated | Δ |
|---|---|---|---|
| $I_{sc}$ (A) | 5.69 | 5.47 | −3.9% |
| $V_{oc}$ (V) | 0.609 | 0.607 | −0.3% |
| $I_{max}$ (A) | 5.16 | 4.93 | −4.5% |
| $V_{max}$ (V) | 0.462 | 0.459 | −0.6% |
| FF (%) | 68.8 | 68.0 | −1.2% |
| P (W) | 2.384 | 2.26 | −5.2% |
| Eff | 15.3 | 14.5 | −5.2% |

| Si 6-125 | No encapsulation | Encapsulated | Δ |
|---|---|---|---|
| $I_{sc}$ (A) | 5.65 | 5.34 | −5.5% |
| $V_{oc}$ (V) | 0.609 | 0.604 | −0.8% |
| $I_{max}$ (A) | 5.11 | 4.82 | −5.7% |
| $V_{max}$ (V) | 0.463 | 0.462 | −0.2% |
| FF (%) | 68.8 | 69.1 | 0.4% |
| P (W) | 2.367 | 2.230 | −5.8% |
| Eff (%) | 15.1 | 14.3 | −5.3% |

| Silicon 2-300 | No encapsulation | Encapsulated | Δ |
|---|---|---|---|
| $I_{sc}$ (A) | 5.64 | 5.38 | −4.6% |
| $V_{oc}$ (V) | 0.609 | 0.606 | −0.5% |
| $I_{max}$ (A) | 5.09 | 4.82 | 5.3% |
| $V_{max}$ (V) | 0.459 | 0.464 | 1.1% |
| FF (%) | 67.9 | 68.6 | 1.0% |
| P (W) | 2.336 | 2.236 | −4.3% |
| Eff | 15.0 | 14.3 | −4.7% |

It may be seen that for all these examples, the modules perform well electrically after the encapsulation. The matching of the refractive indices of the fibers and the resin thus enables a very good performance of the photovoltaic modules.

Various aspects of the present disclosure are set out in the following numbered clauses:

Clause 1. A photovoltaic module comprising one or more photovoltaic cells encapsulated in a fiber-reinforced composite material, the photovoltaic cells having a front side to be irradiated and a back side, wherein at the front side of the photovoltaic cells,
 the fiber-reinforced composite material comprises a substantially transparent resin, and substantially transparent fibers, wherein
 the refractive indices of the resin and the fibers are substantially the same.

Clause 2. A photovoltaic module according to clause 1, wherein at the front side of the photovoltaic cells, a resin and fiber are selected for achieving low void content.

Clause 3. A photovoltaic module according to clause 1 or 2, wherein at the front side of the photovoltaic cells, the fibers are glass fibers.

Clause 4. A photovoltaic module according to clause 3, wherein for the front side of the photovoltaic cells, the glass fibers are treated with a silane coupling agent.

Clause 5. A photovoltaic module according to clause 4, wherein the silane coupling agents are aminosilane coupling agents, Clause 6. A photovoltaic module according to any of clauses 1-5, wherein for the front side of the photovoltaic cells, the resin is an epoxy resin.

Clause 7. A photovoltaic module according to clause 6, wherein for the front side of the photovoltaic cells, the epoxy resin is composed of diglycidyl ether of bisphenol A and bisphenol F or alternatively is an aliphatic or cycloaliphatic epoxy resin.

Clause 8. A photovoltaic module according to any of clauses 1-7, wherein the fiber-reinforced composite material for the front side of the photovoltaic modules is different than the fiber-reinforced composite material for the back side of the photovoltaic modules.

Clause 9. A photovoltaic module according to clause 8, wherein the fibers on the front side are different from the fibers on the back side and the resin is the same.

Clause 10. A photovoltaic module according to any of clauses 1-9, wherein the resin on the front side of the photovoltaic cells includes additives for UV resistance.

Clause 11. A photovoltaic module according to any of clauses 1-10, wherein the photovoltaic cells are one or more of the following: crystalline silicon photovoltaic cells, thin film photovoltaic cells, organic photovoltaic cells and multijunction photovoltaic cells or others.

Clause 12. Method of manufacturing a photovoltaic module comprising one or more crystalline silicon photovoltaic cells, the method comprising:
  providing a mold,
  providing one or more photovoltaic cells in the mold,
  providing reinforcement fibers in the mold both on a front face of the cells and on a back face of the cells,
  positioning and sealing a bag surrounding a cavity of the mold,
  creating a vacuum in the bag, and
  infusing the mold with the resin due to the created vacuum, wherein
  the creating a vacuum in the bag comprises creating the vacuum gradually.

Clause 13. A method according to clause 12, wherein the creating a vacuum in the bag comprises creating an underpressure of a first level relatively rapidly, and gradually increasing the underpressure of the first level until a substantial vacuum is reached.

Clause 14. A method according to clause 13, wherein gradually increasing the underpressure of the first level until substantially a vacuum is reached comprises increasing the underpressure in one or more increments with dwelling periods after each increment.

Clause 15. A method according to clause 14, wherein the underpressure is increased for each increment at a rate of less than 0.2 bar/min.

Clause 16. A method according to clause 14, wherein the underpressure is increased for each increment at a rate of substantially 0.1 bar/min.

Clause 17. A method according to any of clauses 14-16, wherein each increment is 0.05-0.2 bar, optionally about 0.1 bar.

Clause 18. A method according to any of clauses 13-17, wherein the first level is between 0.6-0.85 bar underpressure, preferably between 0.6 and 0.8 bar underpressure.

Clause 19. A method according to any of clauses 13-18, further comprising curing the resin.

Clause 20. A method according to any of clauses 13-19, wherein providing reinforcement fibers in the mold on the front face of the cells comprises providing at least four layers of fibers are placed on the front face of the photovoltaic cells.

Clause 21. A photovoltaic module obtainable by a method according to any of clauses 12-20.

Clause 22. A photovoltaic module according to any of clauses 1-11 as obtained by a method according to any of clauses 12-20.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow.

The invention claimed is:

1. A method for manufacturing a photovoltaic module comprising one or more photovoltaic cells having a front side to be irradiated and a back side, the method comprising:
  providing a mold,
  providing the one or more photovoltaic cells in the mold,
  providing glass fibers with covalently attached aminosilane coupling agents on the front side of the one or more photovoltaic cells in the mold,
  positioning and sealing a bag surrounding a cavity of the mold, and creating a vacuum in the bag, wherein creating the vacuum in the bag comprises creating an underpressure with respect to ambient pressure of a first level of 0.7 bar at a first rate, and then increasing the underpressure of the first level until a second vacuum of 0.8 bar or greater is reached, wherein increasing the underpressure of the first level of 0.7 bar until the second vacuum of 0.8 bar or greater is reached comprises increasing the underpressure in one or more increments of between 0.05 to less than 0.2 bar/min with dwelling periods for 2 minutes after each increment until the second-vacuum of 0.8 bar or greater is reached,
  infusing the mold with an uncured transparent epoxy resin due to the created second vacuum in the bag;
  providing, via the infusion of the mold with the uncured transparent epoxy resin, contact between the uncured transparent epoxy resin and the glass fibers
  providing, via contact between the uncured transparent epoxy resin and the glass fibers, a reaction between the uncured transparent epoxy resin with the aminosilane coupling agents
  providing, via the reaction between the uncured transparent epoxy resin and the aminosilane coupling agents, the refractive indices of the glass fibers and the uncured transparent epoxy resin with a difference of less than 2% from each other in a light wavelength region of 300 nm to 2000 nm, and
  curing the uncured transparent epoxy resin to form a glass-fiber reinforced composite material in which the refractive indices of the glass fibers and a cured transparent epoxy resin differ less than 2% from each other in a light wavelength region of 300 nm to 2000 nm, and wherein the one or more photovoltaic cells are embedded in the glass-fiber reinforced composite material;
  wherein the providing glass fibers with the covalently attached aminosilane coupling agents on the front side of the one or more photovoltaic cells in the mold comprises providing at least four layers of glass fibers on the front side of the one or more photovoltaic cells.

2. The method according to claim 1, wherein the underpressure is increased for each increment at a rate of 0.1 bar/min.

3. The method according to claim 1, wherein each increment is 0.05-0.15 bar/min.

* * * * *